(12) United States Patent
Hatanaka

(10) Patent No.: US 7,474,152 B2
(45) Date of Patent: Jan. 6, 2009

(54) OPERATIONAL AMPLIFIER CIRCUIT

(75) Inventor: Takuya Hatanaka, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 117 days.

(21) Appl. No.: 11/715,329

(22) Filed: Mar. 8, 2007

(65) Prior Publication Data

US 2007/0273443 A1 Nov. 29, 2007

(30) Foreign Application Priority Data

May 26, 2006 (JP) ............................. 2006-147469

(51) Int. Cl.
*H03F 3/26* (2006.01)
*H03F 3/45* (2006.01)

(52) U.S. Cl. ..................................... 330/255

(58) Field of Classification Search ................. 330/255, 330/265, 267
See application file for complete search history.

(56) References Cited

U.S. PATENT DOCUMENTS 4,933,645 A * 6/1990 Kasai ........................... 330/265

6,163,217 A * 12/2000 Matsubara et al. .......... 330/265

FOREIGN PATENT DOCUMENTS

JP 09-219638 A 8/1997

* cited by examiner

*Primary Examiner*—Steven J Mottola
(74) *Attorney, Agent, or Firm*—Arent Fox LLP.

(57) ABSTRACT

An operational amplifier circuit has a differential input circuit including a first transistor, which receives a first input signal and generates a first voltage, and a second transistor, which receives a second input signal and generates a second voltage. An output stage circuit includes a third transistor responsive to the second voltage, a fourth transistor connected to the third transistor, a fifth transistor responsive to the first voltage, and a sixth transistor connected to the fifth transistor. The output stage circuit generates an output signal of the amplifier circuit at a first node between the fifth and sixth transistors. A seventh transistor connected between the third and fourth transistors controls the potential at a second node between the third and seventh transistors to be the same as the potential of the first input signal in correspondence with the first input signal.

14 Claims, 3 Drawing Sheets

OPERATIONAL AMPLIFIER CIRCUIT

CROSS-REFERENCE TO RELATED APPLICATIONS

This application is based upon and claims the benefit of priority from the prior Japanese Patent Application No. 2006-147469, filed on May 26, 2006, the entire contents of which are incorporated herein by reference.

BACKGROUND OF THE INVENTION

The present invention relates to an operational amplifier circuit.

An operational amplifier circuit is often used as a basic operation circuit in a semiconductor integrated circuit device. There is a demand for further improvement in various properties of the basic operation circuit due to the higher integration and lower power consumption of semiconductor integrated circuit devices.

Japanese Laid-Open Patent Publication No. 9-219636 discloses one example of an operational amplifier circuit. This conventional operational amplifier circuit will be described with reference to FIG. 1.

The operational amplifier circuit 10 includes a constant current source 11, a current mirror circuit 12, a differential input circuit 20, and an output stage circuit 30. The constant current source 11 supplies constant current I1 to the current mirror circuit 12. The current mirror circuit 12 includes N-channel MOS transistors N1 and N2. The drain of the transistor N1 is connected to the constant current source 11. The sources of the transistors N1 and N2 are connected to a low potential power supply VS. The drain of the transistor N1 is connected to the gates of the transistors N1 and N2, and the drain of the transistor N2 is connected to the differential input circuit 20.

The differential input circuit 20 includes a differential pair 21 and a current mirror circuit 22. The differential pair 21 includes N-channel MOS transistors N3 and N4. A connection node between the sources of the two transistors N3 and N4 is connected to the drain of the transistor N2. The drains of the transistors N3 and N4 are respectively connected to the drains of P-channel MOS transistors P1 and P2 configuring the current mirror circuit 22. The sources of the transistors P1 and P2 are connected to a high potential power supply VD, and the drain of the transistor P2 is connected to the gates of the transistors P1 and P2.

The gates of the transistors N3 and N4 configuring the differential pair 21 are respectively connected to first and second input terminals T1 and T2 and receive first and second input signals IP and IM, respectively. Therefore, the differential input circuit 20, which is operated based on the bias current I2 supplied from the transistor N2, changes the potential V1 at node A between the transistors N3 and P1 and the potential V2 at node B between the transistors N4 and P2 in a complementary manner by having current flow in accordance with the potential difference between the first and second input signals IP and IM.

The nodes A and B of the differential input circuit 20 are connected to the output stage circuit 30.

The output stage circuit 30 includes P-channel MOS transistors P3 and P4 and a current mirror circuit 31. The current mirror circuit 31 includes N-channel MOS transistors N5 and N6. The gates of the transistors P3 and P4 are connected to the nodes B and A, respectively. Further, the node B is connected to the drain and the gate of the transistor P2. Therefore, the transistor P3 and the transistor P2 operate as a current mirror.

The source of the transistor P3 is connected to the high potential power supply VD, and the drain is connected to the drain of the transistor N5. The transistor P4, which functions as a former transistor of a final output stage, has a source is connected to the high potential power supply VD and a drain connected to an output terminal To. Therefore, drain current I6 corresponding to the gate voltage of the transistor P4 is supplied to the output terminal To.

The transistor N5 has the same element size as the transistor N1 of the current mirror circuit 12. Further, the transistor N5 has a source connected to the low potential power supply VS and a drain connected to the transistor P3 and the gates of the two transistors N5 and N6. The transistor N6 functions as a latter transistor in the final output stage. The transistor N6 has a source connected to the low potential power supply VS and a drain connected to the output terminal To. The drain voltages of the two transistors P4 and N6 are output from the output terminal To as an output signal Vout. The transistor N6 draws in drain current I7 corresponding to the element size ratio of the transistor N5 and the transistor N6 from the output terminal To.

The operational amplifier circuit 10 receives the output signal Vout as the second input signal IM. That is, the second input terminal T2 is connected to the output terminal To, and the operational amplifier circuit 10 operates as a voltage follower. The first input signal IP and the second input signal IM thus become equal when the gate voltage of the transistor P3 and the gate voltage of the output transistor P4 are the same, that is, when the same current is output to the nodes A and B of the current mirror circuit 22 configured by the transistors P1 and P2.

SUMMARY OF THE INVENTION

The problems described below arise when the first input signal IP varies in the operational amplifier circuit 10 of FIG. 1.

When the first input signal IP increases and becomes higher than the second input signal IM, the potential V1 at the node A decreases. Decrease in the potential V1 at the node A, that is, decrease in the gate voltage of the transistor P4 increases the output signal Vout. As a result, the potential of the output signal Vout becomes equal to the potential of the first input signal IP. In this manner, the operational amplifier circuit 10 operates to shift to a state in which the first input signal IP is equal to the output signal Vout (second input signal IM).

When the output signal Vout, or the second input signal IM, increases in a manner following the first input signal IP as described above, the potential V2 at the node B also decreases in the same manner as the potential V1 at the node A. The drain current I5 of the transistor P3 varies as the potential V2 at node B varies, that is, as the gate voltage of the transistor P3 varies. However, the drain voltage of the transistor P3 (potential V3 at node C) is dependent on the drain voltage of the transistor N5 that operates as a diode. The drain voltage of the transistor N5 is substantially constant irrespective of the current value of the drain current I5. The drain voltage of the transistor P3 thus becomes substantially constant. This results in the drain current I5 being substantially constant (see single-dashed line in FIG. 4).

The drain current I6 of the transistor P4 decreases as the output signal Vout increases. The ratio between the drain current I5 of the transistor P3 and the drain current I6 of the transistor P4 changes from the ideal element size ratio. The transistor N6 causes the flow of drain current I7 having a current value corresponding to the element size ratio of the transistor N5 and the transistor N6 with the current mirror circuit 31. The drain current I6 of the transistor P4 decreases as the output signal Vout increases. Thus, the supply current of the drain current I6 of the transistor P4 with respect to the required current value of the drain current I7 of the transistor N6 becomes insufficient and decreases the output signal Vout of the operational amplifier circuit 10. As a result, a difference is created between the first input signal IP and the output signal Vout (second input signal IM). This generates an offset voltage. The drain current I6 increases as the output signal Vout decreases. Thus, the drain current I6 consequently becomes substantially constant (see single-dashed line in FIG. 4) irrespective of the variation of the first input signal IP in the same manner as the drain current I5.

FIG. 2 is a graph showing the input and output characteristic of the first input signal IP and the output signal Vout in the operational amplifier circuit 10 of FIG. 1. The single-dashed line shows the ideal input and output characteristics of an operational amplifier circuit, and the solid line indicates the actual input and output characteristics of the operational amplifier circuit 10 shown in FIG. 1. As the first input signal IP becomes closer to the high potential power supply VD, the potential of the output signal Vout becomes lower than the ideal potential, that is, the first input signal IP. This increases the difference between the output signal Vout and the first input signal IP. In other words, the offset voltage increases as the first input signal IP becomes closer to the high potential power supply VD.

The present invention provides an operational amplifier circuit capable of suppressing the generation of the offset voltage.

One aspect of the present invention is an operational amplifier circuit for generating an output signal from a first input signal and a second input signal. The operational amplifier circuit has a differential input circuit including a first transistor for receiving the first input signal and generating a first voltage and a second transistor for receiving the output signal as the second input signal and generating a second voltage. An output stage circuit is connected to the differential input circuit and includes a third transistor responsive to the second voltage. A fourth transistor is operatively connected to the third transistor. A first node is formed between the third transistor and the fourth transistor. A fifth transistor is responsive to the first voltage. A sixth transistor is connected in series to the fifth transistor. The fourth transistor and the sixth transistor form a first current mirror. A second node is formed between the fifth transistor and the sixth transistor. The output signal is generated at the second node. A control circuit, connected to the differential input circuit and the output stage circuit, controls the potential at the first node using the first input signal.

Another aspect of the present invention is an operational amplifier circuit for generating an output signal from a first input signal and a second input signal. The operational amplifier circuit has a differential input circuit including a first transistor of a first conduction type for receiving the first input signal and generating a first voltage and a second transistor of the first conduction type for receiving the output signal as the second input signal and generating a second voltage. An output stage circuit is connected to the differential input circuit. The output stage circuit includes a third transistor of a second conduction type differing from the first conduction type and being responsive to the second voltage. A fourth transistor of the first conduction type is operatively connected to the third transistor. A fifth transistor of the second conduction type is responsive to the first voltage. A sixth transistor of the first conduction type is connected in series to the fifth transistor. The fourth transistor and the sixth transistor form a first current mirror. A first node is formed between the fifth transistor and the sixth transistor. The output signal is generated at the first node. A seventh transistor of the second conduction type is connected between the third transistor and the fourth transistor and is responsive to a control voltage corresponding to the first input signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figures 1, 2:
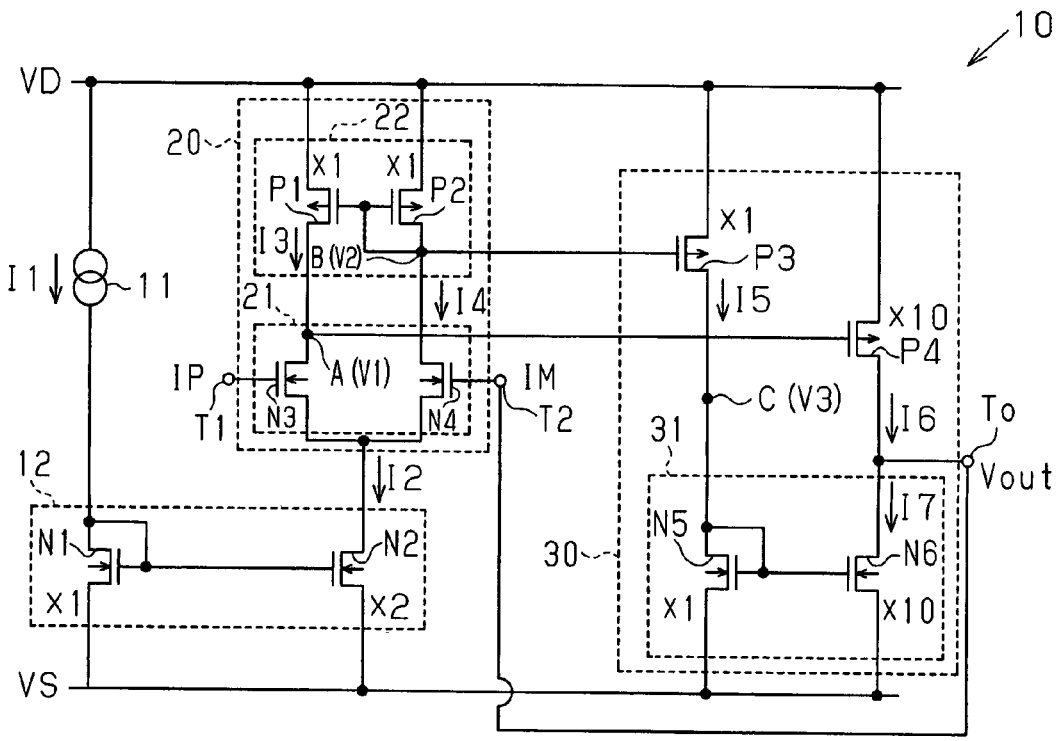
FIG. 1 is a circuit diagram of a conventional operational amplifier circuit.
FIG. 2 is a characteristic diagram showing the input and output characteristic of the operational amplifier circuit of FIG. 1.

In the drawings, like numerals are used for like elements throughout.

Figure 3:
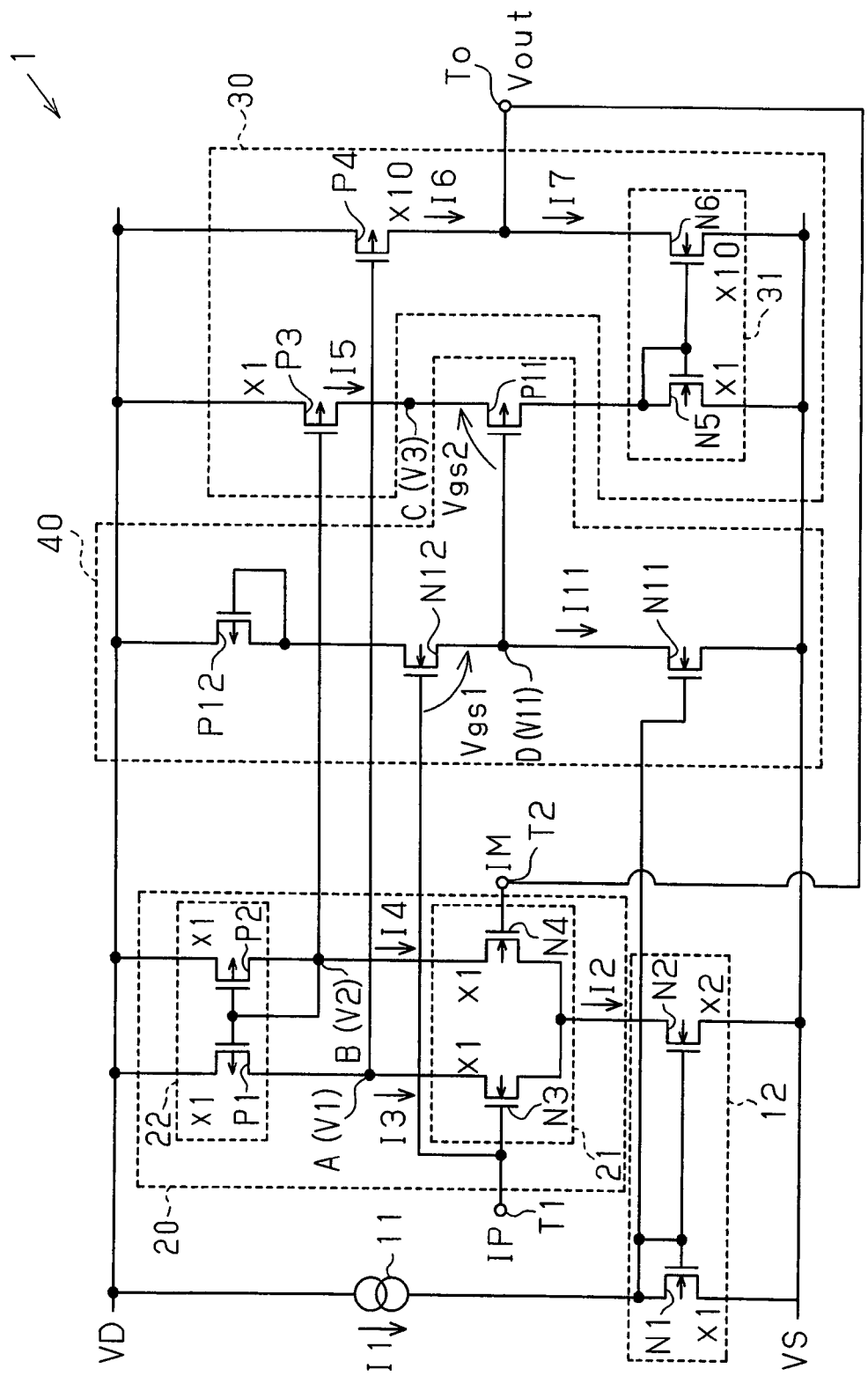
FIG. 3 is a schematic circuit diagram of an operational amplifier circuit according to a preferred embodiment of the present invention.
Figure 4:
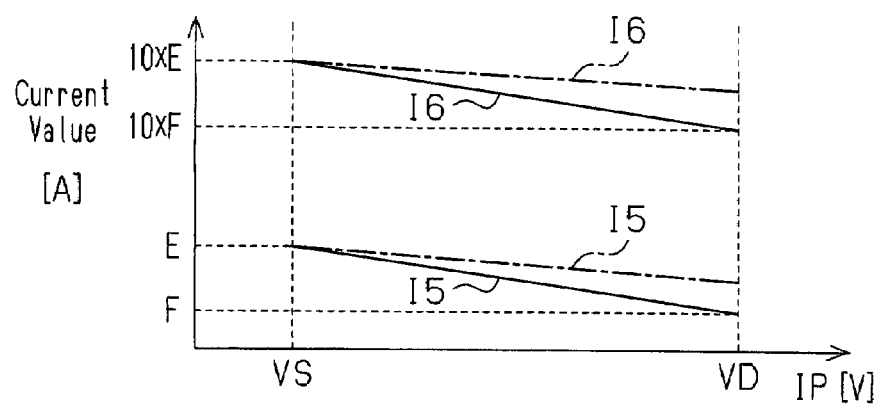
FIG. 4 is a characteristic diagram showing variation in the output current of the operation amplifier circuit of FIG. 3.

An operational amplifier circuit 1 according to a preferred embodiment of the present invention will now be described with reference to FIGS. 3 and 4. FIG. 3 is a schematic circuit diagram of an operational amplifier circuit 1 according to a preferred embodiment of the present invention.

The operational amplifier circuit 1 includes a constant current source 11, a current mirror circuit 12, a differential input circuit 20, an output stage circuit 30, and a control circuit 40. The constant current source 11 supplies constant current I1 to the current mirror circuit 12. The current mirror circuit 12 includes N-channel MOS transistors N1 and N2. The drain of the transistor N1 is connected to the constant current source 11. The sources of the transistors N1 and N2 are connected to the low potential power supply VS, the drain of the transistor N1 is connected to the gates of the transistors N1 and N2, and the drain of the transistor N2 is connected to the differential input circuit 20. The transistor N2 has an element size that is two times greater than that of the input transistor N1. Therefore, the current mirror circuit 12 supplies the differential input circuit 20 with bias current I2 that is two times greater than the drain current of the transistor N1, that is, the constant current I1 of the constant current source 11.

The differential input circuit 20 includes a differential pair 21 configured by N-channel MOS transistors N3 and N4, and a current mirror circuit 22 configured by a pair of P-channel MOS transistors P1 and P2. The gate of the transistor N3, which is connected to the first input terminal T1, receives the first input signal IP provided to the first input terminal T1. The gate of the transistor N4, which is connected to the second input terminal T2, receives the second input signal IM provided to the second input terminal T2. The transistors P1 and P2 are of the same size. Thus, the transistor P1 causes the flow of drain current having a current value that is the same as the drain current of the transistor P2.

A node A between the transistors N3 and P1 and a node B between the transistors N4 and P2 are connected to the gate of the transistor P4 and the gate of the transistors P3 of the output stage circuit 30, respectively. The transistor P3 has a source connected to the high potential power supply VD and a gate connected to the drain and the gate of the transistor P2. Therefore, the transistor P3 and the transistor P2 operate as a current mirror. The transistor P3 has an element size that is the same as the transistor P2 and causes the flows of drain current I5 corresponding to the gate voltage of the transistor P2 (potential V2 at the node B). The transistor P4, which functions as a former transistor in the final output stage, has a source connected to the high potential power supply VD and a drain connected to the output terminal To. The transistor P4, which has an element size that is ten times greater than that of the transistor P1, supplies drain current I6, which corresponds to the element size and the gate voltage (potential V1 of node A) of the transistor P4, to the output terminal To.

The drain and the gate of the transistor N1 are connected to the gate of an N-channel MOS transistor N11 (first constant current source) in the control circuit 40. The transistor N11 has a source connected to the low potential power supply VS and a drain connected to the source of an N-channel MOS transistor N12. That is, the transistor N11 and the transistor N1 operate as a current mirror. Therefore, the transistor N11 supplies drain current I11, which corresponds to the element size ratio of the transistor N1 and the transistor N11, to the transistor N12.

The source of the transistor N12 is connected to the drain of the transistor N11 and to the gate of a P-channel MOS transistor P11. The drain of the transistor N12 is connected to the drain and gate of a P-channel MOS transistor P12 that operates as a diode. The gate of the transistor N12 is connected to the gate of the N-channel MOS transistor N3 configuring the differential pair 21. That is, the gate of the transistor N12 receives the first input signal IP.

The drain of the transistor P12 is connected to the gate of the transistor P12 and to the drain of the transistor N12. The source of the transistor P12 is connected to the high potential power supply VD.

The transistor P11 has a gate, which is connected to a node D (the source of transistor N12) between the transistor N12 and the transistor N11, and a source, which is connected to the drain of the P-channel MOS transistor P3. The drain of the transistor P11 is connected to the drain of the transistor N5 of the current mirror circuit 31. A connection point between the transistor P11 and the transistor P3 is defined as node C. In the preferred embodiment, the element size of the transistor N12 and the transistor P11 and the element size of the transistors N11 and P12 relative to the transistors P3 and N5 are set so that the gate-source voltage Vgs1 of the transistor N12 and the gate-source voltage Vgs2 of the transistor P11 are substantially equal. In the preferred embodiment, the control circuit 40 is configured by transistors N11, N12, P1, and P12.

The current mirror circuit 31 includes a pair of N-channel MOS transistors N5 and N6. The transistor N5 has the same element size as the transistor N1 of the current mirror circuit 12. The transistor N5 has a source connected to the low potential power supply VS and a drain connected to the drain of the transistor P11 and the gates of the two transistors N5 and N6. The transistor N6 functions as the latter transistor in the final output stage. The transistor N6 has a source connected to the low potential power supply VS and a drain connected to the output terminal To. The drain voltages of the two transistors P4 and N6 are output from the output terminal To as the output signal Vout. The transistor N6, which has an element size that is ten times greater than that of the transistor N5, draws in drain current I7 that is ten times greater than that of the drain current of the transistor N5 from the output terminal To.

The operational amplifier circuit 1 receives the output signal Vout as the second input signal IM. Thus, the second input terminal T2 is connected to the output terminal To, and the operational amplifier circuit 1 operates as a voltage follower.

The operation of the operational amplifier circuit 1 will now be discussed.

When the potentials at the first and second input signals IP and IM are substantially equal (IP=IM), the current mirror circuit 12 supplies the differential pair 21 with bias current I2 having a current value that is two times greater than that of the constant current I1 of the constant current source 11.

The bias current I2 is equally distributed to the transistors N3 and N4. Thus, the drain currents I3 and I4 are substantially equal (I3=I4) and have a current value that is one half the bias current I2 (I3=I4=I2×½=I1).

The drain current I5 of the transistor P3 is substantially equal to the drain current I4 of the transistor N4 (I5=I4=I1) due to the current mirror circuit 22 and the current mirror of the transistors P2 and P3. The current mirror circuit 31 generates the drain current I7 having a current value that is ten times greater than that of the drain current I5 of the transistor N5 (I7=I5×10).

If the drain currents I3 and I4 are substantially equal, the potentials V1 and V2 at the nodes A and B, that is, the gate voltages of the transistors P3 and P4 are substantially equal. Thus, the drain currents I5 and I6 of the transistors P3 and P4 are determined by the element size ratio. In other words, the element size of the transistor P4 is ten times greater than that of the transistor P3 (transistors P1 and P2). Thus, the drain current I6 of the transistor P4 has a current value that is ten times greater than the drain current I5 of the transistor P3 (I6=I5×10).

The drain current I6 of the transistor P4 and the drain current I7 of the transistor N6 are substantially equal (I6=I7=I5×10). This stabilizes the potential at the output signal Vout. The second input signal IM is thus held at a potential that is substantially equal to the potential at the first input signal IP (IP=IM).

When the first input signal IP is higher than the second input signal IM (output signal Vout) (IP>IM), the current mirror circuit 12 supplies the differential pair 21 with the bias current I2 having a current value that is two times greater than the constant current I1 of the constant current source I1.

The first input signal IP is higher than the second input signal IM. Thus, the differential pair 21 distributes the bias current I2 to the transistors N3 and N4 such that a greater amount of current is distributed to the transistor N3. Therefore, the drain current I3 of the transistor N3 is greater than one half the bias current I2 of the transistor N2 (I3>I2×½=I1).

When the drain current I3 of the transistor N3 increases and the drain current I4 of the transistor N4 decreases, the potential V1 at the node A decreases and the potential V2 at the node B increases (V1<V2). When the potential V1 of the node A decreases, the gate voltage of the transistor P4 decreases. Thus, the output signal Vout increases. Specifically, the output signal Vout increases in response to the voltage difference between the first input signal IP and the second input signal IM. The increase in the output signal Vout decreases the drain current I6 of the transistor P4.

The drain current I5 of the transistor P3 at this point is as follows. First, the node D between the transistors N11 and N12 has a potential V11 obtained by subtracting the gate-source voltage Vgs1 of the transistor N12 from the gate voltage of the transistor N12 (potential at first input signal IP) (V11=IP−Vgs1). The potential V11 at the node D is supplied to the transistor P11 as a gate voltage. Therefore, the node C has a potential V3 obtained by adding the gate-source voltage Vgs2 of the transistor P11 to the gate voltage of the transistor P11 (potential V11 of the node D) (V3=V11+Vgs2=IP−Vgs1+Vgs2). In the preferred embodiment, the gate-source voltage Vgs1 of the transistor N12 is set to be substantially the same as the gate-source voltage Vgs2 of the transistor P11 due to element size of each of the transistors N5, N11, N12, P3, P11, and P12, as described above. Therefore, the potential V3 at the node C becomes substantially the same as the first input signal as shown by the following equation.

$$V3 = IP - Vgs1 + Vgs2$$
$$= IP - Vgs1 + Vgs1$$
$$= IP$$

The gate-source voltage Vgs1 of the transistor N12 is determined by the drain voltage and the drain current of the transistor N12. In other words, the gate-source voltage Vgs1 of the transistor N12 is determined by the drain voltage of the transistor P12 and the drain current I11 of the transistor N11. The gate-source voltage Vgs2 of the transistor P11 is determined by the drain voltage and the drain current of the transistor P11. In other words, the gate-source voltage Vgs2 of the transistor P11 is determined by the drain voltage of the transistor N5 and the drain current I5 of the transistor P3.

The potential V3 at the node C, that is, the drain voltage of the transistor P3 increases as the first input signal IP increases. In other words, the potential V3 at the node C (drain voltage of the transistor P3) becomes substantially equal to the voltage of the first input signal IP in a manner following the variation of the first input signal IP. This decreases the drain current I5.

The drain current I5 and the drain current I6 in this case will now be described in detail. The output signal Vout increases and the potential V3 at the node C increases as the first input signal IP increases. Therefore, the drain voltage of the transistor P3 and the drain voltage of the transistor P4 become substantially equal. That is, the drain voltages of the transistors P3 and P4 both have the first input signal IP. The drain currents I5 and I6 of the transistors P3 and P4 thus have current values corresponding to their element sizes. That is, both drain currents I5 and I6 decrease as the first input signal IP increases while maintaining the current values at an ideal ratio of 1:10 (I6=I5×10), as shown by the solid line in FIG. 4. More specifically, if the current value of the drain current I5 is "E" when the first input signal IP is equal to the low potential power supply VS, the current value of the drain current I6 becomes "10×E". As the first input signal IP varies to the high potential power supply VD, the current value of the drain current I5 decreases from "E" to "F", and the current value of the drain current I6 decreases from "10×E" to "10×F". Thus, the drain currents I5 and I6 of the transistors P3 and P4 have small current values in the operational amplifier circuit 1 of the preferred embodiment as compared with the conventional operational amplifier circuit 10 (see single-dashed line in FIG. 4) when the first input signal IP increases. This decreases the power consumption.

The current mirror circuit 31 generates the drain current I7 with a current value that is ten time greater than the drain current I5 of the transistor N5 (I7=I5×10). Therefore, the drain current I6 of the transistor P4 and the drain current I7 of the transistor N6 become equal (I6=I7=I5×10) even if the first input signal IP increases. This stabilizes the potential of the output signal Vout, and the second input signal IM is held at a potential substantially equal to the first input signal IP (IP=IM).

When the first input signal IP is lower than the second input signal IM (potential of output signal Vout) (IP<IM), the current mirror 12 supplies the differential pair 21 with bias current I2 having a current value that is two times greater than the constant current I1 of the constant current source 11.

The first input signal IP is lower than the second input signal IM. Thus, the differential pair 21 distributes the bias current I2 to the transistors N3 and N4 such that a greater amount of current is distributed to the transistor N4. Accordingly, the drain current I3 of the transistor N3 is less than one half the bias current I2 of the transistor N2 (I3<I2×1;2=I1).

When the drain current I3 of the transistor N3 decreases, and the drain current I4 of the transistor N4 increases, the potential V1 at the node A increases and the potential V2 of the node B decreases (V1>V2). The gate voltage of the transistor P4 increases when the potential V1 at the node A increases. Therefore, the output signal Vout decreases. Specifically, the output signal Vout decreases in correspondence with the voltage difference between the first input signal IP and the second input signal IM. The decrease in the output signal Vout increases the drain current I6 of the transistor P4.

The potential V3 at the node C between the transistors P3 and P11 becomes substantially equal to the voltage of the first input signal IP (V3=IP) in a manner following the variation of the first input signal IP, as described above. Therefore, the potential V3 at the node C, that is, the drain voltage of the transistor P3 decreases as the first input signal IP decreases. This increases the drain current I5.

In this manner, the output signal Vout and the potential V3 at the node C decreases as the first input signal IP decreases. Therefore, the drain voltage of the transistor P3 and the drain voltage of the transistor P4 become substantially equal, that is, the drain voltages of the transistors P3 and P4 both have the first input signal IP. For this reason, the drain currents I5 and I6 of the transistors P3 and P4 have current values corresponding to their element size. That is, the drain currents I5 and I6 both increase as the first input signal IP decreases while maintaining the ideal current value ratio of 1:10 (I6=I5×10).

The current mirror circuit 31 generates the drain current I7 having a current value that is ten times greater than that of the drain current IS of the transistor N5 (I7=I5×10). Therefore, the drain current I6 of the transistor P4 and the drain current I7 of the transistor N6 become equal (I6=I7=I5×10) even if the first input signal IP decreases. This stabilizes the potential of the output signal Vout and holds the second input signal IM at a potential substantially equal to the first input signal IP (IP=IM).

Figure 5:
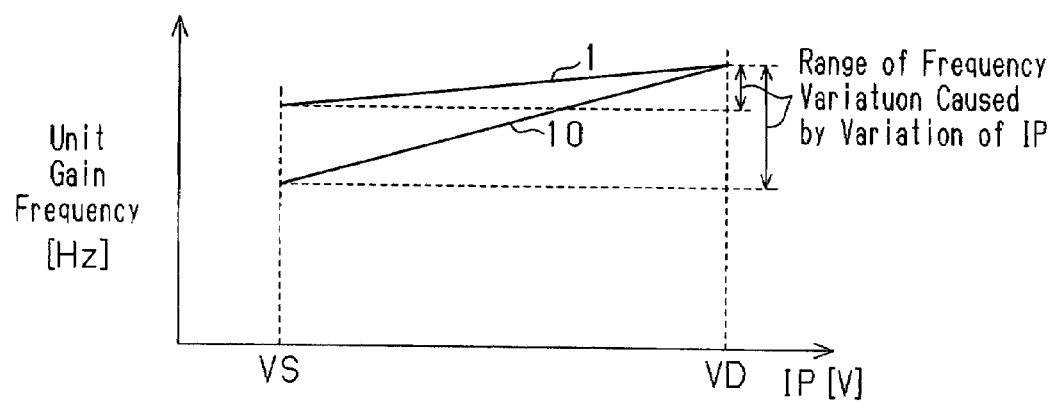
FIG. 5 is a diagram showing the frequency characteristics of the operational amplifier circuit of FIGS. 1 and 3.

FIG. 5 is a graph showing a simulation result regarding the frequency characteristic of the operational amplifier circuit 1 shown in FIG. 3 and the operational amplifier circuit 10 shown in FIG. 1. The simulation was performed with the operational amplifier circuits 1 and 10 having the same power consumption. In FIG. 5, the horizontal axis represents the first input signal IP, and the vertical axis represents the unit gain frequency.

As apparent from FIG. 5, the unit gain frequency of each of the operational amplifier circuits 1 and 10 varies so as to increase when the first input signal IP approaches the high potential power supply VD. However, the frequency of the operational amplifier circuit 1 varies more gradually than the operational amplifier circuit 10. More specifically, the range of unit gain frequency variation caused by the variation of the first input signal IP is small in the operational amplifier circuit 1 of the present invention compared to the conventional operational amplifier circuit 10. That is, the difference between the unit gain frequency when the first input signal IP reaches the high potential power supply VD and the unit gain frequency of when the first input signal IP reaches the low potential power supply VS is small in the operational amplifier circuit 1. Therefore, the change in responding speed caused by variation of the first input signal IP is small in the operational amplifier circuit 1. This stabilizes the responding speed.

Furthermore, the unit gain frequency when the first input signal IP reaches the low potential power supply VS is largely increased in the operational amplifier circuit 1 of the present invention compared to the conventional operational amplifier circuit 10. Therefore, the responding speed of the operational amplifier circuit 1 is significantly increased by adding the transistors N11, N12, P1, and P12, that is, the control circuit 40.

The operational amplifier circuit 1 of the embodiment has the following advantages.

(1) The P-channel MOS transistor P11 is arranged between the transistor P3 and the transistor N5, and the first input signal IP is provided to the gate of the transistor P11 via the N-channel MOS transistor N12. Thus, the potential V3 at the node C varies in a manner following the variation of the first input signal IP. Furthermore, the element size of each of the transistors N5, N11, N12, P3, P11, and P12 is determined so that the gate-source voltages Vgs1 and Vgs2 of the transistors N12 and P11 are substantially equal. The potential at the output signal Vout thus stabilizes even if the first input signal IP varies, in particular, even if the first input signal IP approaches the high potential power supply VD due to increase in the first input signal IP. Therefore, the first input signal IP and the second input signal IM are maintained at substantially the same potential (IP≈IM). Thus the operational amplifier circuit 1 suppresses the generation of offset voltage caused by variation of the first input signal IP.

It should be apparent to those skilled in the art that the present invention may be embodied in many other specific forms without departing from the spirit or scope of the invention. Particularly, it should be understood that the present invention may be embodied in the following forms.

The P-channel MOS transistor P12 in the above embodiment may be omitted. That is, the drain of the N-channel MOS transistor N12 may be directly connected to the high potential power supply VD.

The P-channel MOS transistor P11 in the above embodiment may be changed to an N-channel MOS transistor, and the N-channel MOS transistor N12 may be changed to a P-channel MOS transistor.

The N-channel MOS transistors N11 and N12 and the P-channel MOS transistor P12 in the above embodiment may be omitted. That is, the first input terminal T1 may be directly connected to the gate of the P-channel MOS transistor P11. In this case, the P-channel MOS transistor P11 may be changed to the N-channel MOS transistor.

The transistors P3, P4, N5, and N6 configuring the output stage circuit 30 in the above embodiment may be configured by the P-channel MOS transistor or the N-channel MOS transistor.

In the above embodiment, the P-channel MOS transistors configuring the operational amplifier circuit 1 may each be changed to an N-channel MOS transistor, and the N-channel MOS transistors configuring the operational amplifier circuit 1 may each be changed to a P-channel MOS transistor. Needless to say, in this case, the high potential power supply VD and the low potential power supply VS are exchanged with each other.

The control circuit of the present invention is not limited to the control circuit 40 shown in FIG. 3. In a further embodiment, the control circuit may be formed, for example, by a variable resistor connected between the transistor P3 and the transistor N5. In such control circuit, the resistance value of the variable resistor changes in accordance with the variation of the first input signal IP. More specifically, the control circuit increases the resistance value of the variable resistor as the first input signal IP increases and decreases the resistance value of the variable resistor as the first input signal IP decreases. Thus, the drain voltage of the transistor P3 varies as the first input signal IP varies without being dependent on the voltage of the diode connected transistor N5. As a result, the same advantages as the above embodiment are obtained.

Each transistor in the above embodiment is not limited to a MOS transistor and may be a bipolar transistor.

The present examples and embodiments are to be considered as illustrative and not restrictive, and the invention is not to be limited to the details given herein, but may be modified within the scope and equivalence of the appended claims.

What is claimed is:

1. An operational amplifier circuit for generating an output signal from a first input signal and a second input signal, the operational amplifier circuit comprising:
   a differential input circuit including:
      a first transistor for receiving the first input signal and generating a first voltage; and
      a second transistor for receiving the output signal as the second input signal and generating a second voltage;
   an output stage circuit connected to the differential input circuit and including:
      a third transistor responsive to the second voltage;
      a fourth transistor operatively connected to the third transistor, with a first node being formed between the third transistor and the fourth transistor;
      a fifth transistor responsive to the first voltage; and
      a sixth transistor connected in series to the fifth transistor, with the fourth transistor and the sixth transistor forming a first current mirror, a second node being formed between the fifth transistor and the sixth transistor, and the output signal being generated at the second node; and
   a control circuit, connected to the differential input circuit and the output stage circuit, for controlling the potential at the first node using the first input signal.

2. The operational amplifier circuit according to claim 1, wherein the control circuit is configured to control the potential at the first node so that the potential at the first node becomes substantially the same as the potential of the first input signal.

3. The operational amplifier circuit according to claim 1, wherein the control circuit includes:
   a seventh transistor connected between the third transistor and the fourth transistor and being responsive to a control voltage, the control circuit controlling the control voltage supplied to the seventh transistor using the first input signal.

4. The operational amplifier circuit according to claim 3, wherein the control circuit further includes:
   an eighth transistor responsive to the first input signal and being a conduction type differing from that of the seventh transistor; and a first constant current source connected to the eighth transistor, with a third node being formed between the eighth transistor and the first constant current source;

wherein the seventh transistor receives the potential at the third node as the control voltage.

5. The operational amplifier circuit according to claim 4, wherein the control circuit further includes:
a ninth transistor connected to the eighth transistor to function as a diode.

6. The operational amplifier circuit according to claim 4, further comprising:
a second constant current source; and
a second current mirror circuit connected to the second constant current source and the differential input circuit;
wherein the second current mirror circuit includes:
a tenth transistor connected to the second constant current source; and
an eleventh transistor, connected to the tenth transistor and the differential input circuit, for generating a bias current supplied to the differential input circuit; and
the first constant current source includes:
a twelfth transistor connected to the second constant current source and the tenth transistor, with the tenth transistor and the twelfth transistor forming a third current mirror circuit.

7. The operational amplifier circuit according to claim 3, further comprising:
a fourth current mirror circuit connected to the differential input circuit and the output stage circuit, the fourth current mirror circuit including:
a thirteenth transistor connected to the first transistor; and
a fourteenth transistor connected to the second transistor and the thirteenth transistor, wherein the third transistor is further connected to the fourteenth transistor, and the third transistor and the fourteenth transistor form a fifth current mirror circuit.

8. An operational amplifier circuit for generating an output signal from a first input signal and a second input signal, the operational amplifier circuit comprising:
a differential input circuit including:
a first transistor of a first conduction type for receiving the first input signal and generating a first voltage; and
a second transistor of the first conduction type for receiving the output signal as the second input signal and generating a second voltage;
an output stage circuit connected to the differential input circuit, the output stage circuit including:
a third transistor of a second conduction type differing from the first conduction type and being responsive to the second voltage;
a fourth transistor of the first conduction type operatively connected to the third transistor;
a fifth transistor of the second conduction type responsive to the first voltage; and
a sixth transistor of the first conduction type connected in series to the fifth transistor, with the fourth transistor and the sixth transistor forming a first current mirror, a first node being formed between the fifth transistor and the sixth transistor, and the output signal being generated at the first node; and
a seventh transistor of the second conduction type connected between the third transistor and the fourth transistor and being responsive to a control voltage corresponding to the first input signal.

9. The operational amplifier circuit according to claim 8, wherein a second node is formed between the third transistor and the seventh transistor, and the seventh transistor is configured to control the potential at the second node based on the control voltage so that the potential at the second node becomes substantially the same as the potential of the first input signal.

10. The operational amplifier circuit according to claim 8, further comprising:
an eighth transistor of the first conduction type responsive to the first input signal; and
a first constant current source connected to the eighth transistor, with a third node being formed between the eighth transistor and the first constant current source, wherein the seventh transistor receives the potential at the third node as the control voltage.

11. The operational amplifier circuit according to claim 10, further comprising:
a ninth transistor of the second conduction type connected to the eighth transistor and functioning as a diode.

12. The operational amplifier circuit according to claim 10, further comprising:
a second constant current source;
a tenth transistor of the first conduction type connected to the second constant current source; and
an eleventh transistor of the first conduction type connected to the tenth transistor and the differential input circuit, with the tenth transistor and the eleventh transistor forming a second current mirror circuit, and the eleventh transistor generating a bias current supplied to the differential input circuit;
wherein the first constant current source includes a twelfth transistor of the first conduction type connected to the second constant current source and the tenth transistor, with the tenth transistor and the twelfth transistor forming a third current mirror circuit.

13. The operational amplifier circuit according to claim 8, further comprising:
a thirteen transistor of the second conduction type connected to the first transistor; and
a fourteenth transistor of the second conduction type connected to the second transistor and the thirteenth transistor, with the thirteenth transistor and the fourteenth transistor forming a fourth current mirror circuit;
wherein the third transistor is further connected to the fourteenth transistor, and the third transistor and the fourteenth transistor form a fifth current mirror circuit.

14. The operational amplifier circuit according to claim 12, wherein:
the first to twelfth transistors are each formed by a MOS transistor having a predetermined element size and gate-source voltage;
the eighth transistor has a first gate-source voltage corresponding to the difference between the potential of the first input signal and the potential at the third node;
the seventh transistor has a second gate-source voltage corresponding to the difference between the potential at the third node and the potential at the second node; and
the element size of each of the third, fourth, seventh, eighth, ninth, and twelfth transistors is determined so that the gate-source voltage of the seventh transistor and the gate-source voltage of the eighth transistor become substantially the same.

* * * * *